(12) United States Patent
Desailly et al.

(10) Patent No.: US 6,438,461 B1
(45) Date of Patent: Aug. 20, 2002

(54) METHOD AND DEVICE FOR DISPLACING A MOVING BODY ON A BASE MOUNTED ELASTICALLY WITH RESPECT TO THE GROUND

(75) Inventors: Roger Desailly, Viennne en Val; Jean Levine, Paris; Van Diêp Nguyen, Nemours; Serge Maneuf, Amilly, all of (FR)

(73) Assignee: Newport Corporation, Irvine, CA (US)

( * ) Notice: Subject to any disclaimer, the term of this patent is extended or adjusted under 35 U.S.C. 154(b) by 0 days.

(21) Appl. No.: 09/362,643

(22) Filed: Jul. 27, 1999

(30) Foreign Application Priority Data

Feb. 23, 1999 (FR) ............................................. 99 02224

(51) Int. Cl.[7] .......................... G01M 1/38; G05B 13/00; G05B 15/00; G05B 19/18; G05D 23/00
(52) U.S. Cl. ......................... 700/280; 700/302; 700/56; 700/60; 700/63
(58) Field of Search ................................. 700/280, 302, 700/56, 60, 63; 702/56; 73/570; 248/638

(56) References Cited

U.S. PATENT DOCUMENTS

| | | |
|---|---|---|
| 1,143,165 A | 6/1915 | Begusch |
| 1,306,906 A | 6/1919 | Jaques, Sr. |
| 2,367,139 A | 1/1945 | Ress |
| 3,357,268 A | 12/1967 | Richter |
| 3,442,475 A | 5/1969 | Rivin |
| 3,460,786 A | 8/1969 | Rivin |
| 3,478,608 A | 11/1969 | Met |
| 3,533,012 A | 10/1970 | Johnson et al. |
| 3,565,515 A | 2/1971 | De Mey, II |
| 3,577,791 A | 5/1971 | Vanden Broek |
| 3,578,278 A | 5/1971 | Pickering |
| 3,601,476 A | 8/1971 | MacKenzie |
| 3,620,558 A | 11/1971 | MacMillan |
| 3,667,525 A | 6/1972 | Spieth |
| 3,751,025 A | 8/1973 | Beery et al. |
| 3,917,201 A | 11/1975 | Roll |

(List continued on next page.)

FOREIGN PATENT DOCUMENTS

| | | |
|---|---|---|
| CA | 2199423 | 3/1996 |
| GB | 2 124 402 A | 7/1982 |
| GB | 2 131 971 A | 6/1984 |
| JP | 03021894 | 1/1991 |
| JP | 08088167 | 4/1996 |
| JP | 09330875 | 12/1997 |
| JP | 10144601 | 5/1998 |

OTHER PUBLICATIONS

US 5,880,594, 03/1999, Blakley (withdrawn)

*Primary Examiner*—Leo Picard
*Assistant Examiner*—Ryan Jerrett
(74) *Attorney, Agent, or Firm*—Irell & Manella, LLP

(57) ABSTRACT

The present invention relates to a method and a device for displacing a moving body (4) on a base (2) mounted elastically with respect to the ground (S), the moving body (4) being displaced linearly with a predetermined displacement under the action of a controllable force (F).

According to the invention:
a) a mathematical relationship illustrating the movements of the entity formed by the base (2) and the moving body (4) is defined;
b) using said mathematical relationship there is determined a force (F) which, applied to the moving body (4), produces a combined effect on the moving body (4) so that it performs said predetermined displacement, and on the base (2) at least so that it is immobile at the end of the displacement of the moving body (4); and
c) the force (F) thus determined is applied to the moving body (4).

22 Claims, 1 Drawing Sheet

U.S. PATENT DOCUMENTS

| | | |
|---|---|---|
| 3,945,245 A | 3/1976 | Wadensten |
| 4,030,811 A | 6/1977 | Khoe et al. |
| 4,065,203 A | 12/1977 | Goell et al. |
| 4,079,404 A | 3/1978 | Comerford et al. |
| 4,088,396 A | 5/1978 | Edelstein |
| 4,119,363 A | 10/1978 | Camlibel et al. |
| 4,144,504 A | 3/1979 | Leggett et al. |
| 4,164,363 A | 8/1979 | Hsu |
| 4,167,744 A | 9/1979 | Nyul |
| 4,199,222 A | 4/1980 | Ikushima et al. |
| 4,237,474 A | 12/1980 | Ladany |
| 4,268,113 A | 5/1981 | Noel, jr. |
| 4,295,152 A | 10/1981 | Khoe et al. |
| 4,296,998 A | 10/1981 | Dufft |
| 4,316,678 A | 2/1982 | F'Geppert |
| 4,332,469 A | 6/1982 | Wendland |
| 4,350,867 A | 9/1982 | Kinoshita et al. |
| 4,355,323 A | 10/1982 | Kock |
| 4,357,072 A | 11/1982 | Goodfellow et al. |
| 4,387,956 A | 6/1983 | Cline |
| 4,403,243 A | 9/1983 | Hakamada |
| 4,435,037 A | 3/1984 | Abramson et al. |
| 4,469,399 A | 9/1984 | Cowen et al. |
| 4,469,929 A | 9/1984 | Rosen et al. |
| 4,479,698 A | 10/1984 | Landis et al. |
| 4,500,165 A | 2/1985 | Scholl et al. |
| 4,506,108 A | 3/1985 | Kersch et al. |
| 4,523,802 A | 6/1985 | Sakaguchi et al. |
| 4,523,810 A | 6/1985 | Goss et al. |
| 4,525,659 A | 6/1985 | Imahashi et al. |
| 4,550,410 A | 10/1985 | Chenausky et al. |
| 4,615,031 A | 9/1986 | Eales et al. |
| 4,623,220 A | 11/1986 | Grabbe et al. |
| 4,647,147 A | 3/1987 | Pikulski et al. |
| 4,647,331 A | 3/1987 | Koury, Jr. et al. |
| 4,657,429 A | 4/1987 | Morris |
| 4,664,732 A | 5/1987 | Campbell et al. |
| 4,673,244 A | 6/1987 | Miles |
| 4,673,245 A | 6/1987 | Kling et al. |
| 4,677,290 A | 6/1987 | Mitch |
| 4,678,271 A | 7/1987 | Beaulieu |
| 4,679,908 A | 7/1987 | Goodwin |
| 4,701,013 A | 10/1987 | Jurczysayn et al. |
| 4,702,556 A | 10/1987 | Ishii et al. |
| 4,708,429 A | 11/1987 | Clark et al. |
| 4,714,315 A | 12/1987 | Krause |
| 4,720,163 A | 1/1988 | Goodwin et al. |
| 4,746,195 A | 5/1988 | Auracher et al. |
| 4,747,657 A | 5/1988 | Chaoui et al. |
| 4,748,632 A | 5/1988 | Preston |
| 4,759,600 A | 7/1988 | Caron et al. |
| 4,763,979 A | 8/1988 | Heywang |
| 4,767,174 A | 8/1988 | Carenco et al. |
| 4,773,730 A | 9/1988 | Sedlmayr |
| 4,779,946 A | 10/1988 | Pimpinella et al. |
| 4,779,959 A | 10/1988 | Saunders |
| 4,782,223 A | 11/1988 | Suzuki |
| 4,787,691 A | 11/1988 | Lorenzo et al. |
| 4,800,262 A | 1/1989 | Lentine |
| 4,807,750 A | 2/1989 | Ryder et al. |
| 4,823,220 A | 4/1989 | Milster et al. |
| 4,837,768 A | 6/1989 | Schmid |
| 4,842,397 A | 6/1989 | Eisler |
| 4,850,261 A | 7/1989 | Greene |
| 4,850,671 A | 7/1989 | Finzel |
| 4,854,667 A | 8/1989 | Ebata et al. |
| 4,913,527 A | 4/1990 | Jessop |
| 4,914,867 A | 4/1990 | Saito et al. |
| 4,915,482 A | 4/1990 | Collins et al. |
| 4,938,564 A | 7/1990 | Romero |
| 4,966,474 A | 10/1990 | Geiger |
| 4,978,910 A | 12/1990 | Knox et al. |
| 4,988,159 A | 1/1991 | Turner et al. |
| 4,988,165 A | 1/1991 | Ishii et al. |
| 5,000,415 A | 3/1991 | Sandercock |
| 5,044,719 A | 9/1991 | Nakamura |
| 5,058,124 A | 10/1991 | Cameron et al. |
| 5,062,012 A | 10/1991 | Maeda et al. |
| 5,068,749 A | 11/1991 | Patel |
| 5,077,747 A | 12/1991 | Hemmer et al. |
| 5,132,824 A | 7/1992 | Patel et al. |
| 5,138,496 A | 8/1992 | Pong |
| 5,140,470 A | 8/1992 | Luecke |
| 5,146,532 A | 9/1992 | Hodge |
| 5,150,236 A | 9/1992 | Patel |
| 5,172,160 A | 12/1992 | Van Eijk et al. |
| 5,179,618 A | 1/1993 | Anton |
| 5,183,350 A | 2/1993 | Kramer |
| 5,189,725 A | 2/1993 | Bensel, III et al. |
| 5,191,587 A | 3/1993 | Hanson et al. |
| 5,194,993 A | 3/1993 | Bedzyk |
| 5,214,735 A | 5/1993 | Henneberger et al. |
| 5,218,258 A | 6/1993 | Shirasu et al. |
| 5,218,610 A | 6/1993 | Dixon |
| 5,219,051 A | 6/1993 | Davis |
| 5,245,552 A * | 9/1993 | Andersson et al. ......... 700/280 |
| 5,251,863 A | 10/1993 | Gossman et al. |
| 5,285,995 A | 2/1994 | Gonzalez et al. |
| 5,289,559 A | 2/1994 | Wilson |
| 5,300,755 A | 4/1994 | Nishitani et al. |
| 5,311,278 A | 5/1994 | Rosencher |
| 5,319,435 A | 6/1994 | Melle et al. |
| 5,321,539 A | 6/1994 | Hirabayasi et al. |
| 5,327,061 A | 7/1994 | Gullapalli |
| 5,337,383 A | 8/1994 | DeAngelis et al. |
| 5,367,140 A | 11/1994 | Jonaneh et al. |
| 5,410,145 A | 4/1995 | Coroy |
| 5,428,225 A | 6/1995 | Silva et al. |
| 5,428,635 A | 6/1995 | Zhiglinsky et al. |
| 5,434,944 A | 7/1995 | Kerry et al. |
| 5,434,945 A | 7/1995 | Burek et al. |
| 5,446,519 A | 8/1995 | Makinouchi |
| 5,463,647 A | 10/1995 | Pan |
| 5,469,265 A | 11/1995 | Measures et al. |
| 5,499,261 A | 3/1996 | Welch et al. |
| 5,502,598 A | 3/1996 | Kimura et al. |
| 5,528,718 A | 6/1996 | Ray et al. |
| 5,530,547 A | 6/1996 | Arnold |
| 5,530,785 A | 6/1996 | Sakamoto et al. |
| 5,553,186 A | 9/1996 | Allen |
| 5,563,972 A | 10/1996 | Krausse et al. |
| 5,564,537 A | 10/1996 | Shoureshi |
| 5,570,444 A | 10/1996 | Janssen et al. |
| 5,581,077 A | 12/1996 | Chirovsky et al. |
| 5,598,500 A | 1/1997 | Crespel et al. |
| 5,603,387 A | 2/1997 | Beard et al. |
| 5,617,501 A | 4/1997 | Miller et al. |
| 5,619,609 A | 4/1997 | Pan et al. |
| 5,638,482 A | 6/1997 | Winterhoff et al. |
| 5,653,317 A | 8/1997 | Wakui |
| 5,655,045 A | 8/1997 | Morlion et al. |
| 5,660,255 A | 8/1997 | Schubert et al. |
| 5,668,906 A | 9/1997 | Yamamura et al. |
| 5,673,350 A | 9/1997 | Song et al. |
| 5,689,607 A | 11/1997 | Vincent et al. |
| 5,717,804 A | 2/1998 | Pan et al. |
| 5,725,066 A | 3/1998 | Beard et al. |
| 5,737,132 A | 4/1998 | Luecke et al. |
| 5,745,633 A | 4/1998 | Giebel et al. |
| 5,748,821 A | 5/1998 | Schempp et al. |
| 5,751,877 A | 5/1998 | Ishizaka et al. |

| | | | | | |
|---|---|---|---|---|---|
| 5,757,561 A | 5/1998 | Sechrist et al. | 5,909,324 A | 6/1999 | Bryant et al. |
| 5,758,004 A | 5/1998 | Alarcon et al. | 5,930,057 A | 7/1999 | Sechrist et al. |
| 5,761,360 A | 6/1998 | Grois et al. | 5,941,920 A | 8/1999 | Schubert |
| 5,765,800 A | 6/1998 | Watanabe et al. | 5,946,023 A | 8/1999 | Blanding |
| 5,774,614 A | 6/1998 | Gilliland et al. | 5,963,695 A | 10/1999 | Joyce |
| 5,793,920 A | 8/1998 | Wilkins et al. | 6,016,230 A | 1/2000 | Nunnally et al. |
| 5,793,921 A | 8/1998 | Wilkins et al. | 6,022,005 A | 2/2000 | Gran et al. |
| 5,794,912 A | 8/1998 | Whittaker et al. | 6,198,580 B1 | 3/2001 | Dallakian |
| 5,812,958 A | 9/1998 | Mayama | 6,209,841 B1 | 4/2001 | Houghton, Jr. et al. |
| 5,823,307 A | 10/1998 | Schubert et al. | | | |
| 5,825,558 A | 10/1998 | Farmiga et al. | | | |
| 5,852,519 A | 12/1998 | Do et al. | | | |

* cited by examiner

METHOD AND DEVICE FOR DISPLACING A MOVING BODY ON A BASE MOUNTED ELASTICALLY WITH RESPECT TO THE GROUND

BACKGROUND OF THE INVENTION

The present invention relates to a method and to a device for displacing a moving body on a base mounted elastically with respect to the ground.

In the context of the present invention, said device comprises, in addition to the moving body and the base, a controllable actuator, for example an electric motor, intended to bring about a linear displacement of the moving body on the base.

The latter is mounted on the ground via elastic mounts which are intended to isolate it from vibration originating from said ground.

However, when the moving body is made to move, during its acceleration and deceleration phases, the base is subjected to the reaction of the force applied to the moving body by the actuator. This reaction force excites the base which then oscillates on its supports. This disturbs the relative position of the moving body with respect to the base, and has a very harmful effect on the precision of the device.

This error in relative position remains after the end of displacement of the moving body and does not disappear until after the base is stabilized (which takes place a great deal later).

DESCRIPTION OF THE PRIOR ART

Various solutions for overcoming this drawback are known. Some of these solutions in particular envisage:

- immobilizing the base during the acceleration and deceleration phases using a locking system, for example an electromagnetic locking system, which is mounted in parallel with the elastic mounts. This known solution does, however, prevent the mounts from isolating the base from vibration originating from the ground during said acceleration and deceleration phases;
- canceling the effect produced by the force generated by the actuator by providing an additional actuator which is arranged between the base and the ground and which generates an additional force of the same amplitude but of opposite sense; or
- displacing an additional moving body on the base with a similar displacement but of opposite sense with respect to the displacement of the moving body, so as to cancel the inertial effects.

However, none of these known solutions is satisfactory because their effectiveness is low and they all require additional means (locking system, additional actuator, additional moving body) which, in particular, increase the complexity, cost and bulk of the device.

SUMMARY OF THE INVENTION

The object of the present invention is to overcome these drawbacks. The invention relates to a method for displacing a moving body extremely precisely and at a low cost on a base mounted elastically with respect to the ground, said moving body being displaced linearly with a predetermined displacement in terms of distance and time, under the action of a controllable force.

To this end, said method is noteworthy according to the invention in that:

a) a mathematical relationship illustrating the movements of the entity formed by the base and the moving body and dependent on parameters related to the base and to the moving body and which vary during a displacement of the latter, is defined;

b) using said mathematical relationship, mathematical processing is used to determine a force which, applied to said moving body, produces a combined effect:
  - on the one hand, on the moving body so that it performs said predetermined displacement; and
  - on the other hand, on the base at least so that it is immobile at the end of the displacement of the moving body; and c) the force thus determined is applied to said moving body.

Thus, the force applied to the moving body allows the latter to effect the envisaged predetermined displacement, particularly in terms of time and in terms of distance, while at the same time rendering the base immobile at the end of the displacement so that it does not oscillate and does not disrupt the relative positioning between it and the moving body.

In consequence, because of this combined effect or control of the moving body and of the base, an extremely precise displacement of the moving body is obtained in a frame of reference that is independent of the base and linked, for example, with the ground.

It will be noted that the implementation of the method according to the invention is not restricted to a displacement along a single axis, but can also be applied to displacements along several axes which may be considered as being independent.

In the context of the present invention, it is possible to use various mathematical relationships, particularly a mathematical relationship obtained, for example, by deconvolution.

However, in a preferred and simplified embodiment, by way of mathematical relationship in the aforementioned step a), use is advantageously made of the following relationship:

$$y = x - \frac{k1}{k0}\dot{x} + \frac{1}{m}\left(mB - \frac{k1^2}{k0}\right)xB - \frac{mB}{m} \cdot \frac{k1}{k0}\dot{x}B.$$

in which:

y represents an imaginary variable;

k0 and k1 respectively represent the natural frequency and the damping of the elastically mounted base;

m and mB represent the masses of the moving body and of the base, respectively;

x and xB represent the displacements of the moving body and of the base, respectively; and $\dot{x}$ and $\dot{x}B$ represent the speeds of displacement of the moving body and of the base, respectively.

As far as step b) of the method according to the invention is concerned, various mathematical processing operations may be performed, particularly processing operations which employ:

a sum of sinusoidal functions; or a polynomial decomposition.

For this last type of processing operation, the force F is advantageously determined from the following relationship:

$$F = m\ddot{y} + m\frac{k1}{k0} y^{(3)} + \frac{mmB}{k0} y^{(4)}$$

$\ddot{y}$, $y^{(3)}$ and $y^{(4)}$ being the 2nd, 3rd and 4th-order derivatives of the variable y, respectively, and using the following polynomial decomposition of y(t):

$$y(t)=y0+(y1-y0)s^5(126-420s+540s^2-315s^3+70s^4)$$

with $$s = \frac{t-t0}{t1-t0}, \; y0 = y(t0) \text{ and } y1 = y(t1),$$

t being time and t0 and t1 being the instants of the start and end of the displacement of the moving body.

The present invention also relates to a device of the type comprising:
- a base mounted elastically with respect to the ground;
- a moving body which can be displaced linearly on said base; and
- a controllable actuator capable of applying a force to said moving body with a view to displacing it on said base.

According to the invention, said device is noteworthy in that it additionally comprises means, for example a computer:
- which carry out steps a) and b) of the aforementioned method to calculate a force which, applied to said moving body, makes it possible to obtain the aforementioned combined effect; and
- which determine a control command and transmit it to said actuator so that it applies the force thus calculated to the moving body at the time of displacement.

Thus, in addition to the aforementioned advantages, the device according to the invention requires no additional mechanical means, and this reduces its cost and bulk and simplifies its production, compared with the known and aforementioned devices.

BRIEF DESCRIPTION OF THE DRAWINGS

The figures of the appended drawing will make it easy to understand how the invention may be achieved. In these figures, identical references denote similar elements.

DESCRIPTION OF THE PREFERRED EMBODIMENT

Figure 1:
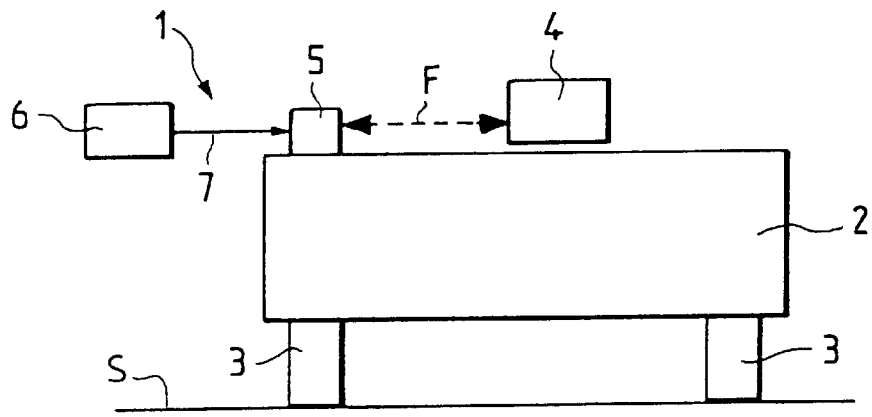
FIG. 1 is the block diagram of a device in accordance with the invention.

The device 1 in accordance with the invention and depicted diagrammatically in FIG. 1 is intended for the displacement of a moving body 4, for example a moving carriage, on a base 2, particularly a test bench.

This device 1 may, for example, be applied to high-speed XY tables used in microelectronics, to machine tools, to conveyors, to robots, etc.

In a known way, said device 1 comprises, in addition to the base 2 and the moving body 4:
- elastic mounts 3 of a known type arranged between the base 2 and the ground S and allowing the base 2 to be isolated from vibration originating from said ground S. The natural frequency of the base 2 on said elastic mounts 3 is generally a few hertz;
- means, not depicted, for example a rail, fixed to the base 2 and allowing the moving body 4 to be displaced linearly on said base 2; and
- a controllable actuator 5, preferably an electric motor, capable of applying a force F to said moving body 4 with a view to displacing it on the base 2.

According to the invention, said device 1 has been improved in such a way as to obtain, directly at the end of a displacement of the moving body 4, a precise positioning of the latter in a reference frame, not depicted, that is independent of the moving body and of the base and linked, for example, with the ground, at the same time overcoming the problems due to the base 2 beginning to oscillate when the moving body 4 accelerates and decelerates.

To achieve this, the device 1 additionally comprises, according to the invention, calculation means 6 which calculate a particular force F which is intended to be transmitted in the form of a control command to the actuator 5 and which is such that, when applied to said moving body 4, it produces a combined effect (and therefore combined control):
- on the one hand on (over) the moving body 4 so that it carries out exactly the intended displacement, particularly as far as the prescribed duration and distance of the displacement are concerned; and
- on the other hand, on (over) the base 2 at least so that it is immobile at the end of the displacement of the moving body 4.

Thus, since by virtue of the device 1, the base 2 is immobilized at the end of the displacement, it does not disturb the positioning of the moving body 4 in the aforementioned reference frame and this means that said moving body 4 is positioned in a stable position right from the end of its displacement. Furthermore, as its displacement is performed precisely, its position corresponds exactly within said reference frame to the desired position.

To achieve this, according to the invention, said means 6:
a) define a mathematical relationship illustrating the movements of the entity formed by the base 2 and the moving body 4 and dependent on parameters relating to the base 2 and to the moving body 4 and which vary as the latter is displaced; and
b) from said mathematical relationship use mathematical processing to determine a force F which, applied to said moving body 4, produces the aforementioned combined effect.

Within the context of the present invention, there are a number of mathematical relationships that may be used and a number of different mathematical processing operations which may be performed.

Before discussing a preferred means of calculation, the conditions and assumptions of the relevant problem will be specified, namely:
- the moving body 4 has a mass m and is displaced without friction on the base 2 of mass mB;
- the base 2 is connected to the ground S elastically with a stiffness k0 and damping k1; and
- the movements of the base 2 are assumed to be restricted to displacements parallel to the displacement of the moving body 4.

By way of illustration, masses:

$$\begin{cases} m = 40 \text{ kg} \\ mB = 800 \text{ kg} \end{cases},$$

give:

$$\begin{cases} k0 = mB(5.2\pi)^2 = 5 \text{ Hz} \\ k1 = 0.3\sqrt{k0.mB} = 0.3 \end{cases}$$

Further incorporating:

x the position of the center of mass of the moving body 4 in the aforementioned reference frame linked, for example, with the ground S;

xB the position of the center of mass of the base 2 in said reference frame; and F the force applied to the moving body 4, the equation of forces can be written:

$$\begin{cases} m\ddot{x} = F \\ mB\ddot{x}B = -F - k0xB - k1\dot{x}B \end{cases}$$

In a preferred embodiment, the means 6 by way of mathematical value in the aforementioned step a) make use of the following imaginary variable y:

$$y = x - \frac{k1}{k0}\dot{x} + \frac{1}{m}\left(mB - \frac{k1^2}{k0}\right)xB - \frac{mB}{m} \cdot \frac{k1}{k0}\dot{x}B. \quad (1)$$

This variable has the noteworthy property of summarizing all the movements of the entity formed by the moving body 4 and the base 2. This is because the position and speed of the base 2 and moving body 4, and the force F can be expressed as a function of y and its derivatives up to the 4th order derivatives ($y^{(i)}$ being the ith-order derivative of y).

$$\begin{cases} x = y + \frac{k1}{k0}\dot{y} + \frac{mB}{k0}\ddot{y} \\ \dot{x} = \dot{y} + \frac{k1}{k0}\ddot{y} + \frac{mB}{k0}y^{(3)} \\ xB = -\frac{m}{k0}\ddot{y} \\ \dot{x}B = -\frac{m}{k0}y^{(3)} \\ F = m\ddot{y} + m\frac{k1}{k0}y^{(3)} + \frac{mmB}{k0}y^{(4)}. \end{cases} \quad (2)$$

Thus, if it is sought to bring about the required displacements of the moving body 4 and of the base 2, all that is required is to provide a trajectory of y, which is a polynomial with respect to time, which interpolates the initial and final conditions, namely the moving body 4 is displaced from a position x0 at rest ($\dot{x}0=0$) at an instant t0 marking the start of the displacement, to a position x1 at rest ($\dot{x}1=0$) at an instant t1 marking the end of the displacement, and the base 2 is immobile ($\dot{x}B=0$) at the instants t0 and t1 at the position of equilibrium xB.

This therefore gives:

$$\begin{cases} x(t0) = x0, \dot{x}(t0) = 0, xB(t0) = 0, \dot{x}B(t0) = 0, F(t0) = 0 \\ x(t1) = x1, \dot{x}(t1) = 0, xB(t1) = 0, \dot{x}B(t1) = 0, F(t1) = 0 \end{cases}$$

namely:

$$\begin{cases} y(t0) = x0, \dot{y}(t0) = 0, \ddot{y}(t0) = 0, y^{(3)}(t0) = 0, y^{(4)}(t0) = 0 \\ y(t1) = x1, \dot{y}(t1) = 0, \ddot{y}(t1) = 0, y^{(3)}(t1) = 0, y^{(4)}(t1) = 0. \end{cases}$$

To obtain a polynomial trajectory that is exploitable in terms of y, the minimal degree, given the fact that there are 10 initial and final conditions, is equal to 9, namely:

$$y(t) = y0 + (y1-y0)s^5(126 - 420s + 540s^2 - 315s^3 + 70s^4) \quad (3)$$

with $$s = \frac{t - t0}{t1 - t0}, \; y0 = y(t0) \text{ and } y1 = y(t1).$$

The force F, and the parameters x, $\dot{x}$, xB and $\dot{x}$B are then deduced from the aforementioned relationships (2) and from the relationship (3).

Figure 2:
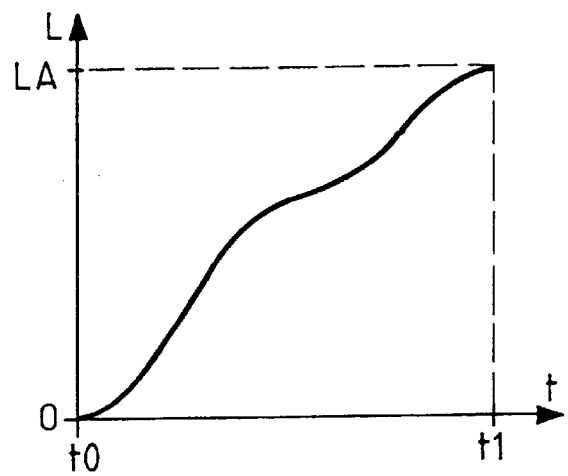
FIGS. 2 and 3 depict graphs which illustrate the displacements of the moving body and of the base respectively when said moving body is made to move in accordance with the invention.
Figure 3:
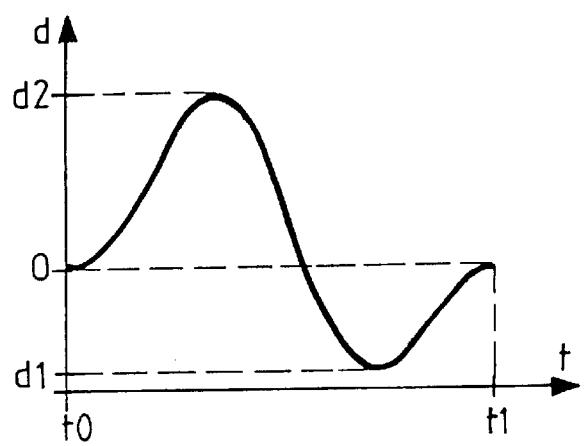

FIGS. 2 and 3 depict the displacements L and d between the instants t0 and t1, of the moving body 4 and of the base 2, respectively, not in the aforementioned reference frame linked with the ground, but in unidirectional frames of reference associated with these items.

Thus, the moving body 4 is displaced by a distance LA, such that LA=x1−x0.

The base 2 is displaced to the maximum of distances d1 and d2 on each side of the position of equilibrium xB, respectively, this position of equilibrium corresponding to the distance d=0 of FIG. 3.

Of course the embodiment described above is not the only possible embodiment in the context of the present invention.

Thus, in the aforementioned step a), it is possible to use other mathematical relationships that yield the same result.

Furthermore, in a particular embodiment, it is possible to use a different formulation than the aforementioned one, also taking account of the imaginary variable y [aforementioned relationship (1)]. In this case, use is made of:

Y the Laplace transform of said imaginary variable y; and

X, Xb and F1, the Laplace transforms of the temporal variables x, xB and F defined in the aforementioned relationships (2).

This formulation comprises three polynomials P0(p), Px(p) and Pb(p) of the Laplace variable p, which satisfy:

$$\begin{cases} F1 = P0(p) \cdot Y \\ X = Px(p) \cdot Y \\ Xb = Pb(p) \cdot Y \end{cases}$$

Furthermore, in step b), instead of employing a mathematical processing operation comprising a polynomial decomposition, as described hereinabove, it is possible to employ a mathematical processing operation that comprises, for example, a sum of sinusoidal functions.

In particular, it is possible to use a sinusoidal decomposition of the form:

$$y(t) = y0 + (y1 - y0) \cdot \sum_{k=1}^{k=n} ak \cdot \sin[(k\pi/2) \cdot (t - t0/t1 - t0) + \varphi k]$$

in which:

y1 and y0 are the final and initial positions; and t1 and t0 are the final and initial times, as indicated above.

Furthermore, ak and ϕk are parameters which are determined using the same initial and final conditions as those mentioned earlier.

What is claimed is:

1. A method for displacing a moving body (4) on a base (2) mounted elastically with respect to the ground (S), said moving body (4) being displaced linearly with a predetermined displacement under the action of a controllable force (F), wherein:
   a) a mathematical relationship illustrating the movements of the entity formed by the base (2) and the moving body (4) and dependent on parameters related to the base (2) and to the moving body (4) wherein said parameters vary during a displacement of the moving body, is defined;
   (b) using said mathematical relationship, mathematical processing is used to determine a force (F) which, applied to said moving body (4), produces a combined effect:
      on the one hand, on the moving body (4) so that it performs said predetermined displacement; and
      on the other hand, on the base (2) at least so that it is immobile at the end of the displacement of the moving body (4); and
   (c) the force (F) thus determined is applied to said moving body (4).

2. A method as claimed in claim 1, wherein by way of mathematical relationship in step a), use is made of the following relationship:

$$y = x - \frac{k1}{k0}\dot{x} + \frac{1}{m}\left(mB - \frac{k1^2}{k0}\right)xB - \frac{mB}{m} \cdot \frac{k1}{k0}\dot{x}B.$$

in which:

y represents an imaginary variable;

k0 and k1 respectively represent the natural frequency and the damping of the elastically mounted base (2);

m and mB represent the masses of the moving body (4) and of the base (2), respectively;

x and xB represent the displacements of the moving body (4) and of the base (2), respectively; and $\dot{x}$ and $\dot{x}B$ represent the speeds of displacement of the moving body (4) and of the base (2), respectively.

3. A method as claimed in claim 1, wherein, in step b), the mathematical processing operation employs a sum of sinusoidal functions.

4. A method as claimed in claim 1, wherein, in step b), the mathematical processing operation employs a polynominal decomposition.

5. A method as claimed in claim 2, wherein, in step b), the force F is determined from the following relationship:

$$F = m\ddot{y} + m\frac{k1}{k0}y^{(3)} + \frac{mmB}{k0}y^{(4)},$$

$\ddot{y}$, $y^{(3)}$ and $y^{(4)}$ being the 2nd, 3rd and 4th-order derivatives of the variable y, respectively, and using the following polynomial decomposition of y(t):

$$y(t) = y0 + (y1-y0)s^5(126 - 420s + 540s^2 - 315s^3 + 70s^4)$$

with $$s = \frac{t - t0}{t1 - t0}, y0 = y(t0) \text{ and } y1 = y(t1),$$

t being time and t0 and t1 being the instants of the start and end of the displacement of the moving body (4).

6. A device, comprising:
   a base;
   a body coupled to said base;
   an actuator coupled to said body; and,
   a computer that provides a control command to said actuator, said control command induces a force profile that causes said body to move from a start position at a start time to an end position at an end time, so that said base has a zero displacement at the end time, the force profile being dependent on parameters related to said base and said body, said parameters vary as said body moves from the start to end positions.

7. The device of claim 6, wherein the force profile is dependent upon an imaginary variable.

8. The device of claim 7, wherein the imaginary variable is the expression $y = x - k1/k0 \cdot \dot{x} + 1/m \cdot (mB - k0) \cdot xB - mB/m \cdot k1/k0 \cdot \dot{x}B$, where y is the imaginary variable, x is a position of a center of said body, xB is a position of a center of said base, $\dot{x}$ and $\dot{x}B$ are the time base derivatives of x and xB, respectively, m is a mass of said body, mB is a mass of said base, k0 is a natural frequency of said base and k1 is a damping of said base.

9. The device of claim 8, wherein the force profile causes said base to have a positive displacement and then a negative displacement when said body is moved by said actuator.

10. The device of claim 8, wherein the imaginary variable is expressed as a polynomial.

11. The device of claim 8, wherein the imaginary variable is expressed as a sinusoidal decomposition.

12. A device, comprising:
    a base;
    a body coupled to said base;
    an actuator coupled to said body; and,
    calculation means for generating a control command that is provided to said actuator, said control command induces a force profile that causes said body to move from a start position at a start time to an end position at an end time, so that said base has a zero displacement at the end time, the force profile being dependent on parameters related to said base and said body, said parameters vary as said body moves from the start to end positions.

13. The device of claim 12, wherein the force profile is dependent upon an imaginary variable.

14. The device of claim 13, wherein the imaginary variable is the expression $y = x - k1/k0 \cdot \dot{x} + 1/m \cdot (mB - k1/k0) \cdot xB - mB/m \cdot k1/k0 \cdot \dot{x}B$, where y is the imaginary variable, x is a position of a center of said body, xB is a position of a center of said base, $\dot{x}$ and $\dot{x}B$ are the time base derivatives of x and xB, respectively, m is a mass of said body, mB is a mass of said base, k0 is a natural frequency of said base and k1 is a damping of said base.

15. The device of claim 14, wherein the force profile causes said base to have a positive displacement and then a negative displacement when said body is moved by said actuator.

16. The device of claim 14, wherein the imaginary variable is expressed as a polynomial.

17. The device of claim 14, wherein the imaginary variable is expressed as a sinusoidal decomposition.

18. A method for moving a body relative to a base, comprising:

calculating a control command to move the body with a force; and, exerting a force onto the body, the force having a force profile that causes the body to move from a start position at a start time to an end position at an end time, so that said base has a zero displacement at the end time, the force profile being dependent on parameters related to said base and said body, said parameters vary as said body moves from the start to end positions.

19. The method of claim 18, wherein the force profile is dependent upon an imaginary variable.

20. The method of claim 19, wherein the imaginary variable is the expression $y = x - k1/k0 \cdot \dot{x} + 1/m \cdot (mB - k1/k0) \cdot xB - mB/m \cdot k1/k0 \cdot \dot{x}B$, where y is the imaginary variable, x is a position of a center of the body, xB is a position of a center of the base, $\dot{x}$ and $\dot{x}B$ are the time base derivatives of x and xB, respectively, m is a mass of the body, mB is a mass of the base, k0 is a natural frequency of the base and k1 is a damping of the base.

21. The method of claim 20, wherein the imaginary variable is expressed as a polynomial.

22. The method of claim 20, wherein the imaginary variable is expressed as a sinusoidal decomposition.

* * * * *